United States Patent
Lee

(10) Patent No.: US 8,339,919 B1
(45) Date of Patent: Dec. 25, 2012

(54) DISK DRIVE MARGINING READ CHANNEL BY BIASING LOG-LIKELIHOOD RATIOS OF A NONBINARY ITERATIVE DECODER

(75) Inventor: Patrick J. Lee, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/325,309

(22) Filed: Dec. 14, 2011

(51) Int. Cl.
*G11B 7/00* (2006.01)
*H03M 13/03* (2006.01)
*G11B 5/09* (2006.01)

(52) U.S. Cl. .......... 369/59.22; 369/47.15; 714/794; 360/53

(58) Field of Classification Search .......... 714/795, 714/794; 360/39, 31, 65, 66, 53; 369/59.22, 369/59.26, 47.15, 47.18, 47.19, 47.2; 375/346, 375/350, 232
See application file for complete search history.

(56) References Cited

U.S. PATENT DOCUMENTS

| | | | |
|---|---|---|---|
| 5,786,951 A | 7/1998 | Welland et al. | |
| 6,731,443 B2 | 5/2004 | Bliss et al. | |
| 6,771,442 B2 | 8/2004 | Bliss et al. | |
| 7,372,651 B2 | 5/2008 | Gunderson et al. | |
| 7,555,071 B2 | 6/2009 | Sontowski | |
| 7,606,300 B2 * | 10/2009 | Lim | 375/232 |
| 2007/0071140 A1 | 3/2007 | Sontowski | |
| 2009/0086855 A1 | 4/2009 | Jin et al. | |
| 2009/0147890 A1 | 6/2009 | Lee et al. | |

OTHER PUBLICATIONS

Jeruchim, et al., "Simulation of Communication Systems", Plenum Press, New York, 1992, pp. 496-505.
Office Action (non-final) dated May 9, 2012 from U.S. Appl. No. 12/641,899, 12 pages.

* cited by examiner

*Primary Examiner* — Nabil Hindi

(57) ABSTRACT

A disk drive is disclosed comprising a head actuated over a disk and control circuitry operable to sample a read signal emanating from the head to generate read samples. First vectors of log-likelihood ratios (LLRs) are generated in response to the read samples, wherein each vector corresponds to a nonbinary symbol q in a set of symbols. The first vectors of LLRs are biased to generate biased vectors of LLRs, and the biased vectors of LLRs are decoded into a data sequence, wherein the biased vectors of LLRs increase an error rate of the data sequence.

14 Claims, 4 Drawing Sheets

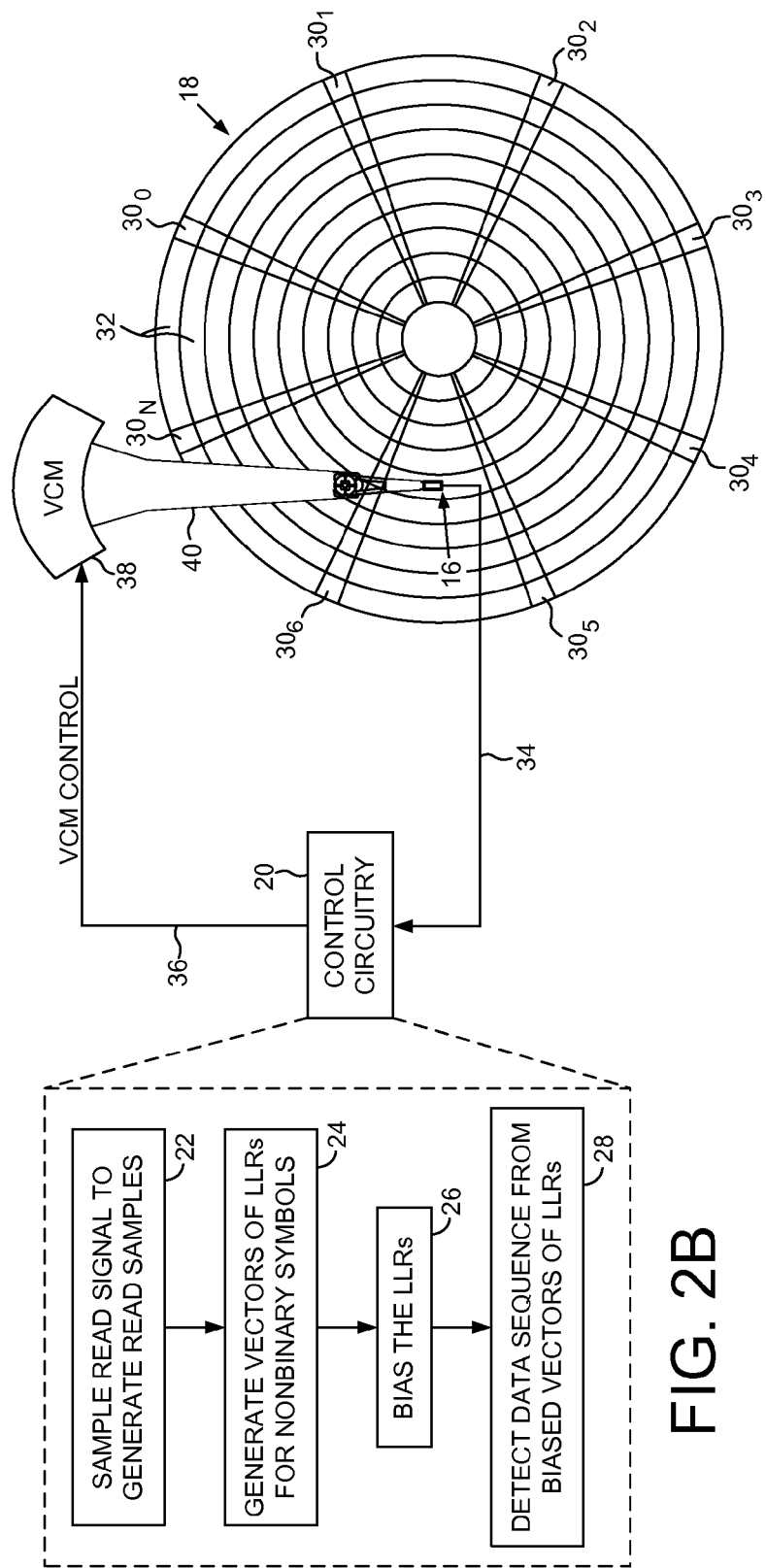

$$p_b(a_n = z | y) = \begin{cases} \alpha p(a_n = q | y) & z = q \\ \dfrac{1 - \alpha p(a_n = q | y)}{1 - p(a_n = q | y)} p(a_n = z | y) & z \neq q \end{cases}$$

FIG. 4A $$LLR_n^b(q) = \begin{cases} 0 & q = 0 \\ \log \alpha \dfrac{1 - p(q)}{1 - \alpha p(q)} + LLR_n(q) & q \neq 0 \end{cases}$$

AND $$LLR_n^b(\bar{q}) = \begin{cases} \log \dfrac{1 - \alpha p(0)}{\alpha(1 - p(0))} + LLR_n(\bar{q}) & q = 0 \\ LLR_n(\bar{q}) & q \neq 0 \end{cases}$$

FIG. 4B $$LLR_n^b(q) = \begin{cases} 0 & q = 0 \\ \log \alpha \dfrac{1 - p_c}{1 - \alpha p_c} + LLR(q) & q \neq 0 \end{cases}$$

AND $$LLR_n^b(\bar{q}) = \begin{cases} \log \dfrac{1 - \alpha p_c}{\alpha(1 - p_c)} + LLR_n(\bar{q}) & q = 0 \\ LLR_n(\bar{q}) & q \neq 0 \end{cases}$$

DISK DRIVE MARGINING READ CHANNEL BY BIASING LOG-LIKELIHOOD RATIOS OF A NONBINARY ITERATIVE DECODER

BACKGROUND

Disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and servo sectors. The servo sectors comprise head positioning information (e.g., a track address) which is read by the head and processed by a servo control system to control the velocity of the actuator arm as it seeks from track to track.

FIG. 1 shows a prior art disk format 2 comprising a plurality of servo tracks 4 defined by a number of servo sectors $6_0$-$6_N$ recorded around the circumference of each servo track. Each servo sector $6_i$ comprises a preamble 8 for storing a periodic pattern, which allows proper gain adjustment and timing synchronization of the read signal, and a sync mark 10 for storing a special pattern used to symbol synchronize to a servo data field 12. The servo data field 12 stores coarse head positioning information, such as a track address, used to position the head over a target data track during a seek operation. Each servo sector $6_i$ further comprises groups of servo bursts 14 (e.g., A, B, C and D bursts), which comprise a number of consecutive transitions recorded at precise intervals and offsets with respect to a servo track centerline. The groups of servo bursts 14 provide fine head position information used for centerline tracking while accessing a data track during write/read operations.

When reading data from the disk, a read channel typically samples the read signal to generate sample values that are equalized into a target response (e.g., a target partial response). A sequence detector detects an estimated data sequence from the equalized samples, and errors in the estimated data sequence are corrected, for example, using an iterative decoder such as a Turbo Code decoder, Low Density Parity Check (LDPC) decoder, or any suitable message passing decoder (a.k.a. belief propagation decoder).

It is desirable to measure the performance of the disk drive in terms of error rate in order to qualify each disk drive as acceptable and/or calibrate various parameters of each disk drive (e.g., by selecting a data density or calibrating read channel parameters). Since the error rate of an iterative decoder is typically very low, it is desirable to margin the read channel in order to expedite the qualification and/or the calibration procedures.

BRIEF DESCRIPTION OF THE DRAWINGS

FIG. 2A shows a disk drive according to an embodiment of the present invention comprising a head actuated over disk.

FIG. 2B is a flow diagram according to an embodiment of the present invention wherein vectors of LLRs are biased to increase an error rate of a detected data sequence.

FIGS. 4A-4C show equations according to embodiments of the present invention for biasing the vectors of LLRs.

DETAILED DESCRIPTION OF EMBODIMENTS OF THE INVENTION

Figure 1:
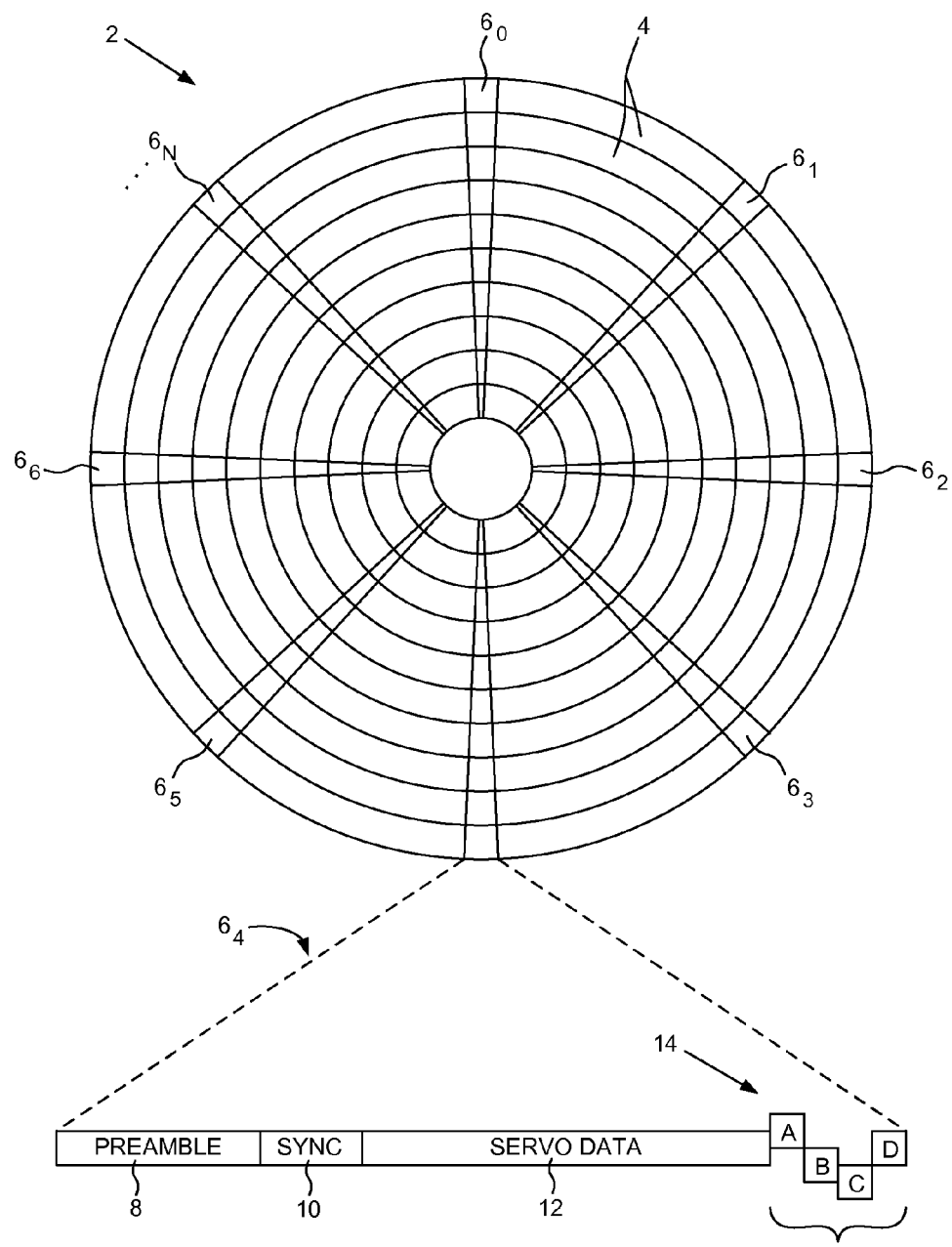
FIG. 1 shows a prior art disk format comprising a plurality of servo tracks defined by embedded servo sectors.

FIG. 2A shows' a disk drive comprising a head 16 actuated over a disk 18 and control circuitry 20 operable to execute the follow diagram of FIG. 2B, wherein a read signal emanating from the head is sampled to generate read samples (step 22) and first vectors of log-likelihood ratios (LLRs) are generated in response to the read samples (step 24), wherein each vector corresponds to a nonbinary symbol q in a set of symbols. The first vectors of LLRs are biased to generate biased vectors of LLRs (step 26), and the biased vectors of LLRs are decoded into a data sequence (step 28), wherein the biased vectors of LLRs increase an error rate of the data sequence.

In the embodiment of FIG. 2A, the disk 18 comprises embedded servo sectors $30_0$-$30_N$ that define a plurality of servo tracks 32. The control circuitry 20 processes the read signal 34 emanating from the head 16 to demodulate the servo sectors $30_0$-$30_N$ and generate a position error signal (PES) representing an error between the actual position of the head and a target position relative to a target track. The control circuitry 20 filters the PES using a suitable compensation filter to generate a control signal 36 applied to a voice coil motor (VCM) 38 which rotates an actuator arm 40 about a pivot in order to actuate the head 16 radially over the disk in a direction that reduces the PES. The servo sectors $30_0$-$30_N$ may comprise any suitable position information, such as a track address for coarse positioning and servo bursts for fine positioning.

Figure 3A:
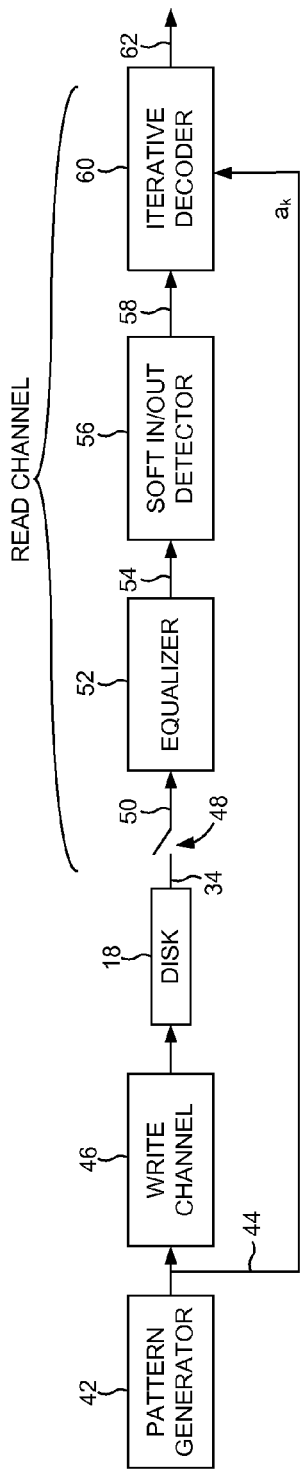
FIG. 3A shows control circuitry according to an embodiment of the present invention comprising a soft input/output detector and an iterative decoder.

FIG. 3A shows control circuitry according to an embodiment of the present invention comprising a pattern generator 42 operable to generate a test pattern 44 that is written to the disk 18 through a write channel 46 which modulates a write current in a write element (e.g., an inductive write element). During read back, the test pattern 44 is read from the disk 18 to generate a read signal 34 that is sampled 48 to generate read samples 50. The read samples 50 are equalized 52 according to a target response (e.g., partial response), and the equalized samples 54 processed by a soft input/output sequence detector 56. The soft input/output sequence detector 56 generates vectors of log-likelihood ratios (LLRs) 58 representing a likelihood that a nonbinary symbol in the equalized samples 54 corresponds to a nonbinary symbol in the test pattern 44. The vectors of LLRs 58 are processed by an iterative decoder 60 executing a suitable message passing algorithm which further resolves the vectors of LLRs and then makes a decision on which symbol is represented by each vector of LLRs. The resulting data sequence 62 may be processed using additional error detection and correction circuitry (e.g., a Reed-Solomon code) before the data sequence 62 is transmitted to the host.

The data detection algorithms in the read channel of FIG. 3A are typically very accurate making it difficult to qualify and/or calibrate the components of the disk drive by measuring an error rate of the detected data sequence. That is, without margining the read channel it may take an unacceptable long period of time to generate a meaningful error rate that can be used to qualify and/or calibrate the disk drive. Accordingly, in an embodiment of the present invention the vectors of LLRs processed to detect the data sequence are biased in order to margin the read channel while qualifying and/or calibrating the disk drive.

Figure 3B:
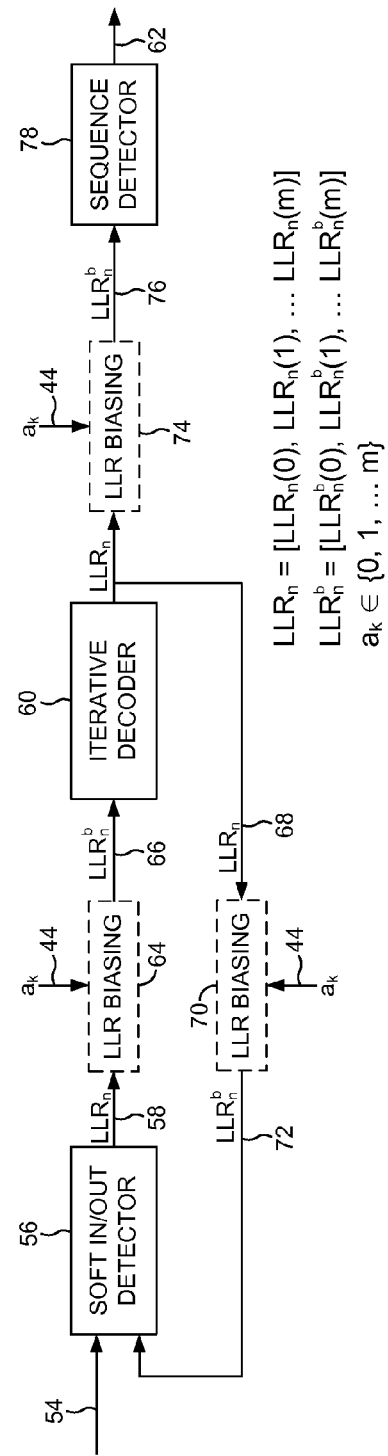
FIG. 3B shows control circuitry according to an embodiment of the present invention including different possible locations for biasing the vectors of LLRs.

FIG. 3B shows control circuitry according to an embodiment of the present invention for biasing the vectors of LLRs.

The vectors of LLRs may be biased at any suitable point along the read channel path, and in one embodiment the vectors of LLRs may be biased at multiple points. In the embodiment shown in FIG. 3B, the vectors of LLRs 58 generated by the soft input/output sequence detector 56 may be biased 64 to generate biased vectors of LLRs 66 input into the iterative decoder 60. Additionally, or alternatively, the vectors of LLRs 68 generated by the iterative decoder 60 may be biased 70 to generate biased vectors of LLRs 72 that are fed back to the input of the soft input/output sequence detector 56. Additionally, or alternatively, the vectors of LLRs 68 generated by the iterative decoder 60 may be biased 74 to generate biased LLRs 76 input into a sequence detector 78 that makes the decision as to the symbol each biased vector of LLRs 76 represents.

In one embodiment, the soft input/output sequence detector 56 executes a suitable sequence detection algorithm, such as a suitable soft input/output Viterbi algorithm or a suitable Maximum A Posteriori (MAP) algorithm. In addition, in one embodiment the iterative decoder 60 executes a suitable message passing algorithm (a.k.a., belief propagation algorithm) which performs a series of local iterations for generating and updating vectors of LLRs for each node of a graph structure (e.g., in a LDPC code). In one embodiment, the vectors of LLRs generated during the local iterations of the iterative decoder may be biased (not shown) to margin the detection algorithm. Although not required, FIG. 3B also illustrates an embodiment wherein the vectors of LLRs 68 generated by the iterative decoder 60 are passed back to the soft input/output sequence detector 56 in order to perform global iterations on the vectors of LLRs.

Since the soft input/output sequence detector 56 and iterative decoder 60 operate according to probabilistic algorithms, in one embodiment these algorithms are margined by modifying the probability distribution function (PDF) of the vectors of LLRs. For a binary system, LLRs are defined as:

$$LLR_n = \frac{p(a_n = 1 | y)}{p(a_n = 0 | y)}$$

where $a_n$ represents the bit at time n and where $y=y_1, y_2, \ldots, y_N$, and $y_n$ represent the noisy sample corresponding to bit n of a received codeword. In this case, the decision as to which bit was sent (+1 or −1) can be made based on the sign of the LLR. For a nonbinary system, $a_n$ is a nonbinary symbol in $GF(2^p)$ and a vector of LLRs for symbol n is defined as:

$$LLR_n(q) = \log \frac{p(a_n = q | y)}{p(a_n = 0 | y)}$$

for all $q \square GF(2^p)$. In this definition, the most likely symbol will be:

$$\operatorname*{argmax}_{q \in GF(2P)} LLR_n(q).$$

In one embodiment, the vectors of LLRs in a nonbinary system are biased by decreasing $p(a_n|y)$ by a factor of $\alpha$ for the correct symbol and increasing $p(a_n|y)$ for the incorrect symbols accordingly. If q is the correct symbol, then in one embodiment the probability distribution may be biased according to the equation shown in FIG. 4A where $0 \leq \alpha \leq 1$ is the bias parameter. Using the biased probabilities, equations for biasing the vector of LLRs for the correct symbol q and for the incorrect symbol $\bar{q}$ is shown in FIG. 4B where $p(z)=p(a_n=z|y)$. In an embodiment where the channel is symmetric and the probability of a correct symbol is $p_c=1-p$ and the probability of an incorrect symbol is $$p_s = \frac{p}{q-1}$$

the equations shown in FIG. 4B can be reduced to the equations shown in FIG. 4C (i.e. it is not necessary to know the probabilities for every symbol). In one embodiment, the equations of FIG. 4B or 4C may be implemented in a lookup table once a suitable value for a has been determined for a marginal passing disk drive.

Any suitable control circuitry may be employed to implement the flow diagrams in the embodiments of the present invention, such as any suitable integrated circuit or circuits. For example, the control circuitry may be implemented within a read channel integrated circuit, or in a component separate from the read channel, such as a disk controller, or certain steps described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into an SOC.

In one embodiment, the control circuitry comprises a microprocessor executing instructions, the instructions being operable to cause the microprocessor to perform the steps of the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry.

What is claimed is:

1. A disk drive comprising:
   a disk;
   a head actuated over the disk; and
   control circuitry operable to:
   sample a read signal emanating from the head to generate read samples;
   generate first vectors of log-likelihood ratios (LLRs) in response to the read samples, wherein each vector corresponds to a nonbinary symbol q in a set of symbols;
   bias the first vectors of LLRs to generate biased vectors of LLRs; and
   decode the biased vectors of LLRs into a data sequence, wherein the biased vectors of LLRs increase an error rate of the data sequence.

2. The disk drive as recited in claim 1, wherein the symbol q is in a set of symbols defined over a finite field $GF(2^p)$ where p is an integer greater than one.

3. The disk drive as recited in claim 1, wherein a soft input/output detector generates the first vectors of LLRs.

4. The disk drive as recited in claim 1, wherein the control circuitry is further operable to:
   write a test pattern to the disk;
   read the test pattern from the disk to generate the read signal; and
   bias the first vectors of LLRs in response to the test pattern.

5. The disk drive as recited in claim 4, wherein the control circuitry is further operable to bias the first vectors of LLRs according to:

$$LLR_n^b(q) = \begin{cases} 0 & q = 0 \\ \log\alpha\frac{1-p(q)}{1-\alpha p(q)} + LLR_n(q) & q \neq 0 \end{cases}$$

and $$LLR_n^b(\overline{q}) = \begin{cases} \log\frac{1-\alpha p(0)}{\alpha(1-p(0))} + LLR_n(\overline{q}) & q = 0 \\ LLR_n(\overline{q}) & q \neq 0 \end{cases}$$

where:
q represents a nonbinary symbol in the test pattern;
$LLR_n(q)$ represents one of the first vectors of LLRs corresponding to the nonbinary symbol q;
$LLR_n^b(q)$ represents one of the biased vectors of LLRs corresponding to the nonbinary symbol q;
$LLR_n(\overline{q})$ represents one of the first vectors of LLRs corresponding to a nonbinary symbol not equal to q;
$LLR_n^b(\overline{q})$ represents one of the biased vectors of LLRs corresponding to a nonbinary symbol not equal to q;
p(x) represents a probability that a nonbinary symbol x was received based on the read samples; and
α is a scalar between zero and one.

6. The disk drive as recited in claim 4, wherein the control circuitry is further operable to bias the first vectors of LLRs according to:

$$LLR_n^b(q) = \begin{cases} 0 & q = 0 \\ \log\alpha\frac{1-p_c}{1-\alpha p_c} + LLR(q) & q \neq 0 \end{cases}$$

and $$LLR_n^b(\overline{q}) = \begin{cases} \log\frac{1-\alpha p_c}{\alpha(1-p_c)} + LLR_n(\overline{q}) & q = 0 \\ LLR_n(\overline{q}) & q \neq 0 \end{cases}$$

where:
q represents a nonbinary symbol in the test pattern;
$LLR_n(q)$ represents one of the first vectors of LLRs corresponding to the nonbinary symbol q;
$LLR_n^b(q)$ represents one of the biased vectors of LLRs corresponding to the nonbinary symbol q;
$LLR_n(\overline{q})$ represents one of the first vectors of LLRs corresponding to a nonbinary symbol not equal to q;
$LLR_n^b(\overline{q})$ represents one of the biased vectors of LLRs corresponding to a nonbinary symbol not equal to q;
$p_c$ represents a probability that a correct nonbinary symbol was received; and
α is a scalar between zero and one.

7. The disk drive as recited in claim 1, wherein an iterative decoder generates the first vectors of LLRs.

8. A method of operating a disk drive comprising a head actuated over a disk, the method comprising:
   sampling a read signal emanating from the head to generate read samples;
   generating first vectors of log-likelihood ratios (LLRs) in response to the read samples, wherein each vector corresponds to a nonbinary symbol q in a set of symbols;
   biasing the first vectors of LLRs to generate biased vectors of LLRs; and
   decoding the biased vectors of LLRs into a data sequence, wherein the biased vectors of LLRs increase an error rate of the data sequence.

9. The method as recited in claim 8, wherein the symbol q is in a set of symbols defined over a finite field $GF(2^p)$ where p is an integer greater than one.

10. The method as recited in claim 8, wherein a soft input/output detector generates the first vectors of LLRs.

11. The method as recited in claim 8, further comprising:
    writing a test pattern to the disk;
    reading the test pattern from the disk to generate the read signal; and
    biasing the first vectors of LLRs in response to the test pattern.

12. The method as recited in claim 11, wherein the first vectors of LLRs are biased according to:

$$LLR_n^b(q) = \begin{cases} 0 & q = 0 \\ \log\alpha\frac{1-p(q)}{1-\alpha p(q)} + LLR_n(q) & q \neq 0 \end{cases}$$

and $$LLR_n^b(\overline{q}) = \begin{cases} \log\frac{1-\alpha p(0)}{\alpha(1-p(0))} + LLR_n(\overline{q}) & q = 0 \\ LLR_n(\overline{q}) & q \neq 0 \end{cases}$$

where:
q represents a nonbinary symbol in the test pattern;
$LLR_n(q)$ represents one of the first vectors of LLRs corresponding to the nonbinary symbol q;
$LLR_n^b(q)$ represents one of the biased vectors of LLRs corresponding to the nonbinary symbol q;
$LLR_n(\overline{q})$ represents one of the first vectors of LLRs corresponding to a nonbinary symbol not equal to q;
$LLR_n^b(\overline{q})$ represents one of the biased vectors of LLRs corresponding to a nonbinary symbol not equal to q;
p(x) represents a probability that a nonbinary symbol x was received based on the read samples; and
α is a scalar between zero and one.

13. The method as recited in claim 11, wherein the first vectors of LLRs are biased according to:

$$LLR_n^b(q) = \begin{cases} 0 & q = 0 \\ \log\alpha\frac{1-p_c}{1-\alpha p_c} + LLR(q) & q \neq 0 \end{cases}$$

and $$LLR_n^b(\overline{q}) = \begin{cases} \log\frac{1-\alpha p_c}{\alpha(1-p_c)} + LLR_n(\overline{q}) & q = 0 \\ LLR_n(\overline{q}) & q \neq 0 \end{cases}$$

where:

q represents a nonbinary symbol in the test pattern;

$LLR_n(q)$ represents one of the first vectors of LLRs corresponding to the nonbinary symbol q;

$LLR_n^b(q)$ represents one of the biased vectors of LLRs corresponding to the nonbinary symbol q;

$LLR_n(\overline{q})$ represents one of the first vectors of LLRs corresponding to a nonbinary symbol not equal to q;

$LLR_n^b(\overline{q})$ represents one of the biased vectors of LLRs corresponding to a nonbinary symbol not equal to q;

$p_c$ represents a probability that a correct nonbinary symbol was received; and α is a scalar between zero and one.

14. The method as recited in claim 8, wherein an iterative decoder generates the first vectors of LLRs.

* * * * *